United States Patent
Chi et al.

(10) Patent No.: US 8,421,203 B2
(45) Date of Patent: Apr. 16, 2013

(54) INTEGRATED CIRCUIT PACKAGING SYSTEM WITH FOLDABLE SUBSTRATE AND METHOD OF MANUFACTURE THEREOF

(75) Inventors: HeeJo Chi, Ichon-si (KR); NamJu Cho, Uiwang-si (KR); HanGil Shin, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 182 days.

(21) Appl. No.: 12/948,756

(22) Filed: Nov. 17, 2010

(65) Prior Publication Data

US 2012/0119393 A1    May 17, 2012

(51) Int. Cl.
| H01L 23/24 | (2006.01) |
| --- | --- |
| H01L 23/02 | (2006.01) |
| H01L 23/34 | (2006.01) |
| H01L 23/48 | (2006.01) |
| H01L 23/52 | (2006.01) |
| H01L 29/40 | (2006.01) |
| H01L 23/28 | (2006.01) |
| H01L 23/29 | (2006.01) |
| H01L 21/00 | (2006.01) |
| H05K 1/00 | (2006.01) |
| H05K 1/16 | (2006.01) |

(52) U.S. Cl.
USPC ........... 257/687; 257/686; 257/723; 257/738; 257/780; 257/786; 257/787; 257/788; 257/E21.449; 257/E23.079; 257/E23.116; 438/124; 174/254; 361/765

(58) Field of Classification Search ........................ None
See application file for complete search history.

(56) References Cited

U.S. PATENT DOCUMENTS

| 6,300,679 | B1 | 10/2001 | Mukerji et al. |
| 6,388,333 | B1 | 5/2002 | Taniguchi et al. |
| 6,798,057 | B2 | 9/2004 | Bolkin et al. |
| 6,876,074 | B2 | 4/2005 | Kim |
| 7,033,911 | B2 * | 4/2006 | Manepalli et al. ............ 438/455 |
| 7,071,555 | B2 | 7/2006 | Kim et al. |
| 7,145,249 | B2 | 12/2006 | Chao et al. |
| 7,345,361 | B2 | 3/2008 | Mallik et al. |
| 7,358,444 | B2 | 4/2008 | Nickerson et al. |
| 7,714,453 | B2 | 5/2010 | Khan et al. |
| 7,777,351 | B1 | 8/2010 | Berry et al. |

(Continued)

OTHER PUBLICATIONS

Definition of term "connector". (n.d.) The American Heritage® Dictionary of the English Language, Fourth Edition. (2003). Retrieved Oct. 31, 2012 from http://www.thefreedictionary.com/connector.*

(Continued)

*Primary Examiner* — Michael Jung
(74) *Attorney, Agent, or Firm* — Ishimaru & Associates LLP (57) ABSTRACT

A method of manufacture of an integrated circuit packaging system includes: providing a package substrate having a foldable segment, a base segment, and a stack segment; connecting a base substrate connector directly on the base segment; connecting a stack substrate connector directly on the stack segment; mounting a base integrated circuit over the base segment with the base substrate connector outside a perimeter of the base integrated circuit; and folding the package substrate with the stack segment over the base segment and the stack substrate connector directly on the base substrate connector.

11 Claims, 4 Drawing Sheets

U.S. PATENT DOCUMENTS

| | | | |
|---|---|---|---|
| 2005/0041399 A1* | 2/2005 | Youker et al. | 361/749 |
| 2007/0013036 A1* | 1/2007 | Zhe et al. | 257/659 |
| 2008/0073769 A1 | 3/2008 | Wu et al. | |
| 2009/0016032 A1 | 1/2009 | Chow et al. | |
| 2009/0016033 A1 | 1/2009 | Chow et al. | |
| 2010/0171205 A1 | 7/2010 | Chen et al. | |

OTHER PUBLICATIONS

Definition of term "attach". (n.d.) The American Heritage® Dictionary of the English Language, Fourth Edition. (2003). Retrieved Oct. 31, 2012 from http://www.thefreedictionary.com/attach.*

* cited by examiner

INTEGRATED CIRCUIT PACKAGING SYSTEM WITH FOLDABLE SUBSTRATE AND METHOD OF MANUFACTURE THEREOF

TECHNICAL FIELD

The present invention relates generally to an integrated circuit packaging system, and more particularly to a system for an integrated circuit packaging system with a substrate.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having a foldable segment, a base segment, and a stack segment; connecting a base substrate connector directly on the base segment; connecting a stack substrate connector directly on the stack segment; mounting a base integrated circuit over the base segment with the base substrate connector outside a perimeter of the base integrated circuit; and folding the package substrate with the stack segment over the base segment and the stack substrate connector directly on the base substrate connector.

The present invention provides an integrated circuit packaging system, including: a package substrate having a foldable segment, a base segment, and a stack segment; a base substrate connector directly on the base segment; a stack substrate connector directly on the stack segment; and a base integrated circuit over the base segment with the base substrate connector outside a perimeter of the base integrated circuit, the stack segment folded over the base segment, and the stack substrate connector directly on the base substrate connector.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
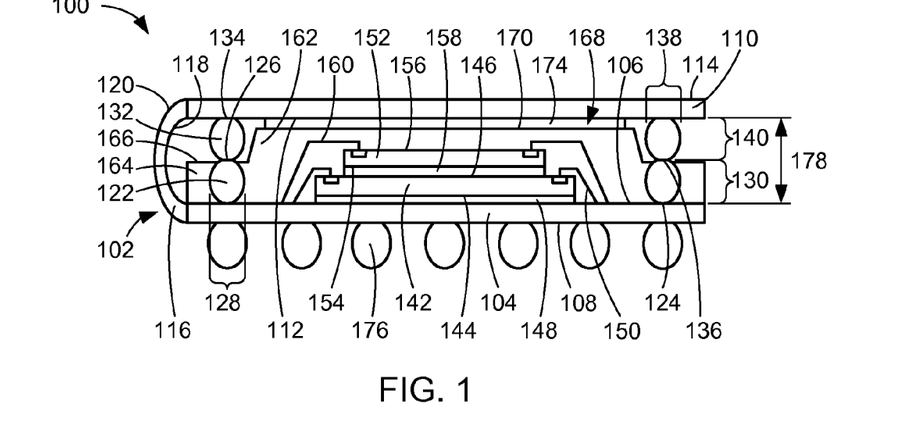
FIG. 1 is a cross-sectional view of an integrated circuit packaging system taken along line 1-1 of FIG. 2 in a first embodiment of the present invention.
Figure 2:
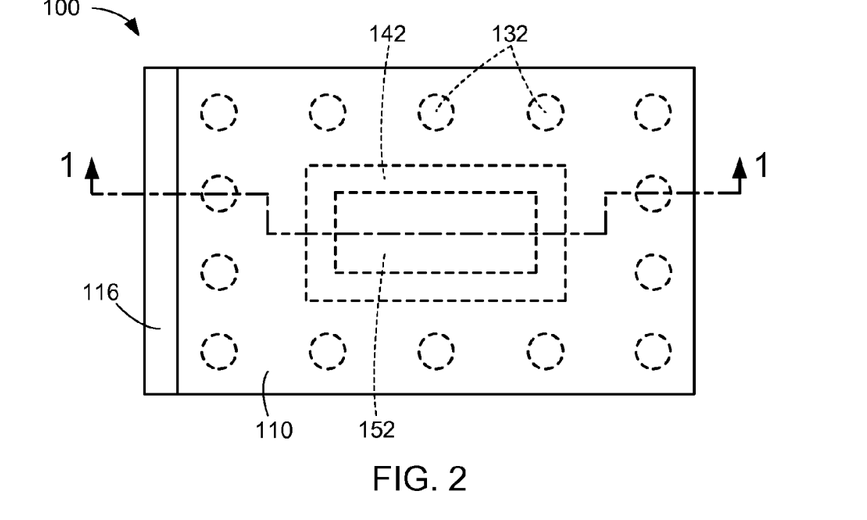
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a package-on-package exposed solder-on-pad (PoP-eSOP) system using a flexible substrate.

The integrated circuit packaging system 100 can include a package substrate 102, which is a support structure formed to mount a semiconductor device thereon and electrically connect the semiconductor device thereto. For example, the package substrate 102 can include a flexible substrate.

The package substrate 102 can include a number of pads, terminals, internal circuits, vertical insertion areas (vias), conductive layers, traces, or a combination thereof to provide electrical connectivity between surfaces of the package substrate 102. The package substrate 102 can include a base segment 104 having a base inward surface 106 and a base outward surface 108 opposite the base inward surface 106. For example, the base segment 104 can include an encapsulation area of the package substrate 102.

The package substrate 102 can include a stack segment 110 having a stack inward surface 112 and a stack outward surface 114 opposite the stack inward surface 112. The package substrate 102 can include a foldable segment 116 having a foldable inward surface 118 and a foldable outward surface 120 opposite the foldable inward surface 118. For example, the stack segment 110 can include a non-encapsulation area of the package substrate 102.

The package substrate 102 can include the foldable segment 116 adjoining or connected to the base segment 104 and the stack segment 110. The package substrate 102 can include the base segment 104, the stack segment 110, and the foldable segment 116 formed as segments separate from each other or formed as a single integral structure. The package substrate 102 can include the base segment 104 with a length approximately equal to a length of the stack segment 110.

The integrated circuit packaging system 100 can include base substrate connectors 122, which are conductive connectors, connected near non-horizontal ends or a periphery of the base segment 104. Each of the base substrate connectors 122 can include a first base vertical end 124 and a second base vertical end 126 opposite the first base vertical end 124. For example, the base substrate connectors 122 can include exposed solder-on-pad (eSOP).

The first base vertical end 124 can be electrically connected to the base inward surface 106. The first base vertical end 124 can be connected directly on the base inward surface 106.

Each of the base substrate connectors 122 can include a base width 128 and a base height 130. The base width 128 is a horizontal distance between lateral extents of each of the base substrate connectors 122. The base height 130 is a vertical distance between the first base vertical end 124 and the second base vertical end 126.

Each of the base substrate connectors 122 can include the base height 130 greater than the base width 128. For example, the base width 128 can be greater than at least half of the base height 130 and less than the base height 130.

For illustrative purposes, the base substrate connectors 122 are shown as elliptical, although it is understood that the base substrate connectors 122 can include any other shapes. For example, the base substrate connectors 122 can be formed with a shape of a rectangle.

The integrated circuit packaging system 100 can include stack substrate connectors 132, which are conductive connectors, connected near non-horizontal ends or a periphery of the stack segment 110. Each of the stack substrate connectors 132 can include a first stack vertical end 134 and a second stack vertical end 136 opposite the first stack vertical end 134. For example, the stack substrate connectors 132 can include solder-on-pad (SOP).

The first stack vertical end 134 can be electrically connected to the stack inward surface 112. The first stack vertical end 134 can be connected directly on the stack inward surface 112.

Each of the stack substrate connectors 132 can include a stack width 138 and a stack height 140. The stack width 138 is a horizontal distance between lateral extents of each of the stack substrate connectors 132. The stack height 140 is a vertical distance between the first stack vertical end 134 and the second stack vertical end 136.

Each of the stack substrate connectors 132 can include the stack height 140 greater than the stack width 138. For example, the stack width 138 can be greater than at least half of the stack height 140 and less than the stack height 140.

For illustrative purposes, the stack substrate connectors 132 are shown as elliptical, although it is understood that the stack substrate connectors 132 can include any other shapes. For example, the stack substrate connectors 132 can be formed with a shape of a rectangle.

The integrated circuit packaging system 100 can include a base integrated circuit 142, which is a semiconductor device, mounted over or on a central portion of the base segment 104. The base integrated circuit 142 can be mounted over the base segment 104 with the base substrate connector 122 outside a perimeter of the base integrated circuit 142.

The base integrated circuit 142 can be mounted between one of the base substrate connectors 122 and another of the base substrate connectors 122. For example, the base integrated circuit 142 can include a semiconductor device including a flip chip, a wirebond die, or an integrated circuit die.

The base integrated circuit 142 can include a base inactive side 144 and a base active side 146 opposite the base inactive side 144. The base integrated circuit 142 can include the base inactive side 144 facing or on the base inward surface 106.

The integrated circuit packaging system 100 can include a base attach layer 148, which attaches the base integrated circuit 142 to the base segment 104. The base attach layer 148 can be attached to the base inward surface 106 and the base inactive side 144.

The integrated circuit packaging system 100 can include a base device connector 150, which electrically connects the base segment 104 and the base integrated circuit 142. The base device connector 150 can be connected to the base inward surface 106 and the base active side 146. For example, the base device connector 150 can include an electrical connector including a bonding wire or a solder bump.

The base device connector 150 can be connected near a periphery of the base integrated circuit 142. The base device connector 150 can be formed adjacent a non-horizontal side of the base integrated circuit 142.

The integrated circuit packaging system 100 can include a stack integrated circuit 152, which is a semiconductor device, mounted over or on a central portion of the base integrated circuit 142. For example, the stack integrated circuit 152 can include a semiconductor device including a flip chip, a wirebond die, or an integrated circuit die.

The stack integrated circuit 152 can include a stack inactive side 154 and a stack active side 156 opposite the stack inactive side 154. The stack integrated circuit 152 can include the stack inactive side 154 facing or on the base active side 146.

The integrated circuit packaging system 100 can include a stack attach layer 158, which attaches the stack integrated circuit 152 to the base integrated circuit 142. The stack attach layer 158 can be attached to the base active side 146 and the stack inactive side 154.

The integrated circuit packaging system 100 can include a stack device connector 160, which electrically connects the base segment 104 and the stack integrated circuit 152. The stack device connector 160 can be connected to the base inward surface 106 and the stack active side 156. For example, the stack device connector 160 can include an electrical connector including a bonding wire or a solder bump.

For illustrative purposes, the base integrated circuit 142 and the stack integrated circuit 152 are shown as wirebond dies, although it is understood that the base integrated circuit 142 and the stack integrated circuit 152 can include any semiconductor devices. For example, the integrated circuit packaging system 100 can include a multichip stack with the base integrated circuit 142 and the stack integrated circuit 152 as flip chips, wirebond dies, or a combination thereof.

The stack device connector 160 can be connected near a periphery of the stack integrated circuit 152 or the base integrated circuit 142. The stack device connector 160 can be formed adjacent a non-horizontal side of the stack integrated circuit 152 or a non-horizontal side of the base integrated circuit 142.

The integrated circuit packaging system 100 can include an encapsulation 162, which covers a semiconductor package to seal a semiconductor device providing mechanical and environmental protection. The encapsulation 162 can include a cover including an encapsulant or a mold material.

The encapsulation 162 can be formed over the base inward surface 106, the base substrate connectors 122, the base integrated circuit 142, the base device connector 150, the stack integrated circuit 152, and the stack device connector 160. The encapsulation 162 can be formed covering the base integrated circuit 142, the base device connector 150, the stack integrated circuit 152, the stack device connector 160, and portions of the base substrate connectors 122. The encapsulation 162 can be formed partially exposing the base substrate connectors 122. The encapsulation 162 can be formed exposing the second base vertical end 126.

The encapsulation 162 can include a step portion 164. The step portion 164 is a portion at a periphery of the encapsulation 162. The step portion 164 can be over the base inward surface 106. The step portion 164 can include a step top side 166 exposing the second base vertical end 126.

The step portion 164 can include the step top side 166 below the second base vertical end 126. In other words, the second base vertical end 126 can be formed protruding upwardly from the step top side 166.

The encapsulation 162 can include a protrusion 168, which extends upwardly from the step top side 166. The protrusion 168 can be formed at a central portion of the encapsulation 162. The protrusion 168 can be formed between the step portion 164 and another of the step portion 164. A top extent of the protrusion 168 can be above the step top side 166.

The encapsulation 162 can include a top surface 170, which is a top extent of the encapsulation 162. The top surface 170 can include the top extent of the protrusion 168. The top surface 170 can be above the step top side 166.

The package substrate 102 can be folded such that the stack segment 110 can be over the base segment 104 and the encapsulation 162 with the stack inward surface 112 facing the top surface 170. Further, with the package substrate 102 folded, the stack substrate connectors 132 can be mounted over the base substrate connectors 122 with the second stack vertical end 136 directly on or connected to the second base vertical end 126. Yet further with the package substrate 102 folded, the protrusion 168 can be adjacent or between one of the stack substrate connectors 132 and another of the stack substrate connectors 132.

The foldable segment 116 can include a predetermined length greater than a length that is approximately equal to a combination of the base height 130 and the stack height 140 in order to provide sufficient spacing for one of the stack substrate connectors 132 to be connected over one of the base substrate connectors 122. For illustrative purposes, the foldable segment 116 is shown as a curve, although it is understood that the foldable segment 116 can include any other shapes.

The integrated circuit packaging system 100 can include a substrate attach layer 174, which attaches the stack segment 110 and the encapsulation 162. The substrate attach layer 174 can be attached to the stack inward surface 112 and the top surface 170.

The substrate attach layer 174 can be between one of the stack substrate connectors 132 and another of the stack substrate connectors 132. For example, the substrate attach layer 174 can include an attach material including an adhesive.

The package substrate 102 can include top terminals (not shown) to provide electrical connectivity to another package that can be mounted on the package substrate 102. The top terminals can be formed at the stack outward surface 114 of the stack segment 110.

The integrated circuit packaging system 100 can provide two ways of connecting the stack outward surface 114 to a top package (not shown). For example, the package substrate 102 folded with the stack substrate connectors 132 directly on the base substrate connectors 122 can provide connectivity between a top package and the base integrated circuit 142 or the stack integrated circuit 152. Also for example, the stack segment 110 having the stack outward surface 114 can provide connectivity between a top package and the base integrated circuit 142 or the stack integrated circuit 152.

The integrated circuit packaging system 100 can include external connectors 176, which are electrical connectors that provide electrical connectivity between the package substrate 102 and an external system (not shown). The integrated circuit packaging system 100 can include a number of the external connectors 176 connected to the base outward surface 108.

The base width 128 and the base height 130 can preferably be approximately equal to the stack width 138 and the stack height 140, respectively, for process simplification purposes. The base height 130 or the stack height 140 can be approximately half of an inward surface distance 178 of the package substrate 102.

The inward surface distance 178 is a distance between the base inward surface 106 and the stack inward surface 112. The inward surface distance 178 can be determined based on the predetermined length of the foldable segment 116. In other words, the foldable segment 116 can include the predetermined length to provide sufficient spacing for the stack substrate connectors 132 connected directly on the base substrate connectors 122.

It has been discovered that the stack substrate connectors 132 connected directly on the base substrate connectors 122 having the base width 128 less than the base height 130 enables fine or reduced pitch for z-interconnection, thereby providing an effective solution to package-on-package bottom stacked die (PoPb-SD) applications and cheaper manufacturing cost compared to other packages having an interposer substrate and re-distribution layer (RDL) as a method for providing connection.

It has also been discovered that the package substrate 102 folded with the stack segment 110 over the base segment 104 improves connectivity between the stack substrate connectors 132 and the base substrate connectors 122 and provides a more simplified process with one fold instead of two folds.

It has further been discovered that the stack outward surface 114 of the stack segment 110 provides a robust connection to a top package compared to a package-on-package embedded solder-on-pad (PoP-eSOP) package having only solder balls thereby enabling substrate patterning simplification and more flexible package circuit wiring as well as achieving a stacked package with less number of embedded solder balls.

It has been unexpectedly found that the step portion 164 of the encapsulation 162 partially exposing the base substrate connectors 122 enhances structural integrity of the base substrate connectors 122 thereby improving reliability.

It has been unexpectedly determined that the substrate attach layer 174 enhances structural integrity between the stack segment 110 and the encapsulation 162.

It has been unexpectedly recognized that the base segment 104 with a length approximately equal to a length of the stack segment 110 provides a robust structure to connect a number of the stack substrate connectors 132 to a number of the base substrate connectors 122.

Referring now to FIG. 2, therein is shown a top view of the integrated circuit packaging system 100. The integrated circuit packaging system 100 can include the foldable segment 116 adjoining the stack segment 110 at an extent or an end of the stack segment 110.

The integrated circuit packaging system 100 can include a number of the stack substrate connectors 132, shown with dash circles, formed adjacent, along, or within a periphery of the stack segment 110. The integrated circuit packaging system 100 can include the base integrated circuit 142 and the stack integrated circuit 152, shown with dash rectangles, surrounded by the stack substrate connectors 132. The integrated circuit packaging system 100 can include the base integrated circuit 142 having a surface area greater than a surface area of the stack integrated circuit 152.

For illustrative purposes, the stack substrate connectors 132 are shown having a shape of a circle, although it is understood that the stack substrate connectors 132 can include any other shapes. Also for illustrative purposes, the base integrated circuit 142 and the stack integrated circuit 152 are shown having a shape of a rectangle, although it is understood that the base integrated circuit 142 and the stack integrated circuit 152 can include any other shapes.

Figure 3:
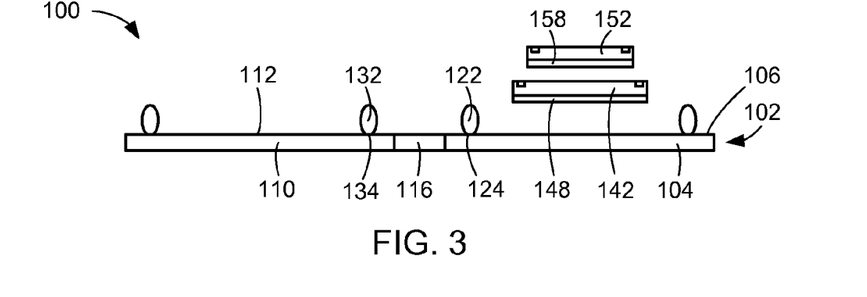
FIG. 3 is a cross-sectional view of the integrated circuit packaging system taken along line 3-3 of FIG. 4 in a first attaching phase of manufacture.
Figure 4:
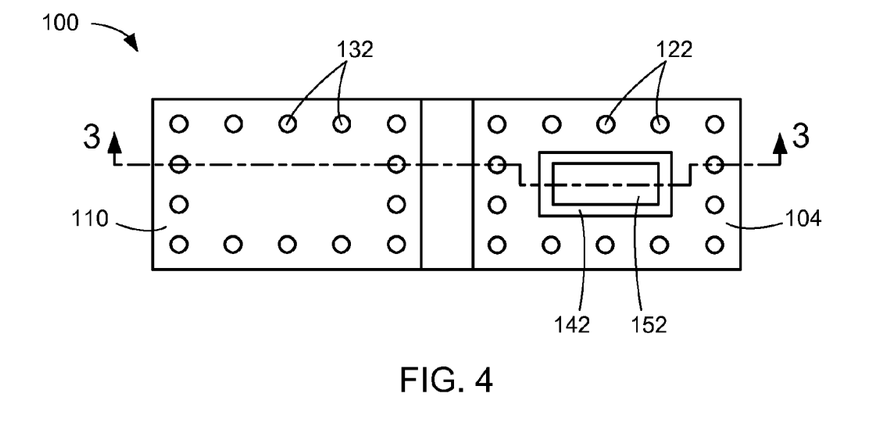
FIG. 4 is a top view of the integrated circuit packaging system in the first attaching phase.

Referring now to FIG. 3, therein is shown a cross-sectional view of the integrated circuit packaging system 100 taken along line 3-3 of FIG. 4 in a first attaching phase of manufacture. The integrated circuit packaging system 100 can include the package substrate 102 having the base segment 104, the stack segment 110, and the foldable segment 116 adjoining the base segment 104 and the stack segment 110.

The base substrate connectors 122 can be connected to the base segment 104. The base substrate connectors 122 can be near non-horizontal ends or a periphery of the base segment 104. The first base vertical end 124 of each of the base substrate connectors 122 can be connected directly on the base inward surface 106 of the base segment 104. For example, the base inward surface 106 can be a top surface of the base segment 104.

The stack substrate connectors 132 can be connected to the stack segment 110. The stack substrate connectors 132 can be near non-horizontal ends or a periphery of the stack segment 110. The first stack vertical end 134 of each of the stack substrate connectors 132 can be connected directly on the stack inward surface 112 of the stack segment 110.

For example, the stack inward surface 112 can be a top surface of the stack segment 110. Also for example, the first attaching phase can include a top solder ball mount (SBM) process to connect the base substrate connectors 122 and the stack substrate connectors 132.

The base substrate connectors 122 and the stack substrate connectors 132 can include conductive balls. The base substrate connectors 122 and the stack substrate connectors 132 can be formed with a conductive material including solder, a metallic material, or a metallic alloy. For example, the base substrate connectors 122 and the stack substrate connectors 132 can include solder balls.

The first attaching phase is shown in a process of mounting the base integrated circuit 142 and the stack integrated circuit 152. The base integrated circuit 142 can be mounted over or attached to the base inward surface 106 with the base attach layer 148. The stack integrated circuit 152 can be mounted over or attached to the base integrated circuit 142 with the stack attach layer 158. For example, the first attaching phase can include a die attach (DA) process to mount the base integrated circuit 142 and the stack integrated circuit 152.

With the base substrate connectors 122 and the stack substrate connectors 132 provided for z-interconnect or vertical interconnection, fine z-interconnect pitch can be enabled providing an effective solution to package-on-package bottom stacked die (PoPb-SD) applications. Compared to a package having a solder-on-pad (SOP) and solder-on-pad (SOP) interconnection, an interconnection with the base substrate connectors 122 and the stack substrate connectors 132 can eliminate a coining process of a bottom solder ball of a z-interconnect. The coining process can be removed before the package substrate 102 can be folded in a subsequent phase.

Referring now to FIG. 4, therein is shown a top view of the integrated circuit packaging system 100 in the first attaching phase. The integrated circuit packaging system 100 can include a number of the base substrate connectors 122 and a number of the stack substrate connectors 132 formed adjacent, along, or within peripheries of the base segment 104 and the stack segment 110, respectively.

The integrated circuit packaging system 100 can include the base integrated circuit 142 and the stack integrated circuit 152 surrounded by the base substrate connectors 122. The base integrated circuit 142 and the stack integrated circuit 152 can be at a central portion of the base segment 104.

Figure 5:
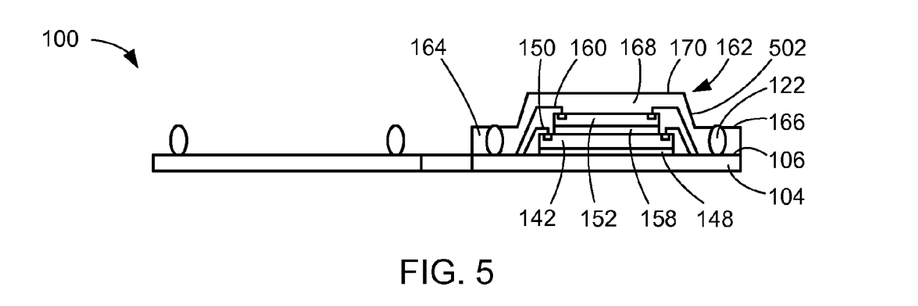
FIG. 5 is the structure of FIG. 3 taken along line 5-5 of FIG. 6 in a molding phase.
Figure 6:
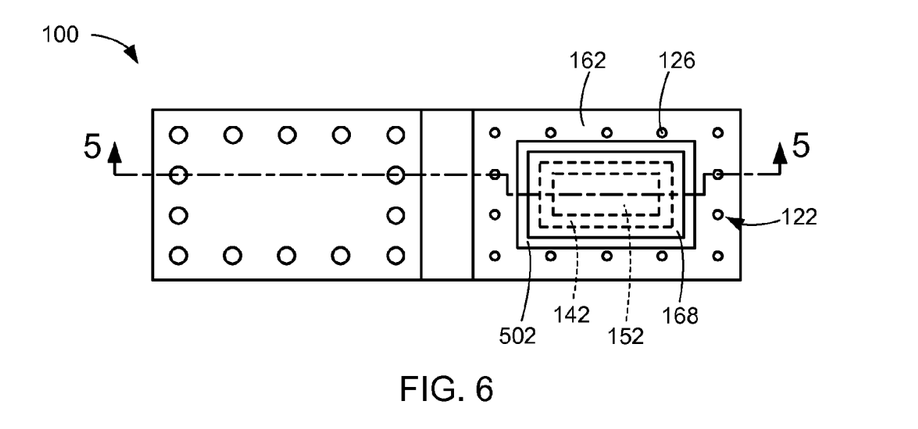
FIG. 6 is a top view of the integrated circuit packaging system in the molding phase.

Referring now to FIG. 5, therein is shown the structure of FIG. 3 taken along line 5-5 of FIG. 6 in a molding phase. The integrated circuit packaging system 100 can include the base device connector 150 and the stack device connector 160 connected to the base integrated circuit 142 and the stack integrated circuit 152, respectively, and the base inward surface 106 of the base segment 104. For example, the molding phase can include a wirebond (W/B) process to connect the base device connector 150 and the stack device connector 160.

The encapsulation 162 can be formed over the base inward surface 106. For example, the encapsulation 162 can be formed over a die area of the base segment 104. The encapsulation 162 can be formed covering the base inward surface 106, the base substrate connectors 122, the base integrated circuit 142, the base attach layer 148, the base device connector 150, the stack integrated circuit 152, the stack attach layer 158, and the stack device connector 160.

The encapsulation 162 can include the step portion 164 and the protrusion 168 extending therefrom. The protrusion 168 can be formed over the base integrated circuit 142, the base device connector 150, the stack integrated circuit 152, and the stack device connector 160.

The protrusion 168 can include a sidewall 502 between the step top side 166 and the top surface 170 of the encapsulation 162. The sidewall 502 can be taper or at an obtuse angle with the step top side 166 or the top surface 170.

The molding phase can include a molding process to form the encapsulation 162. For example, the molding process can include transfer molding.

Referring now to FIG. 6, therein is shown a top view of the integrated circuit packaging system 100 in the molding phase. The integrated circuit packaging system 100 can include the encapsulation 162 exposing the second base vertical end 126 of each of the base substrate connectors 122.

The base integrated circuit 142 and the stack integrated circuit 152, shown with dash rectangles, can be at a central portion of the protrusion 168 of the encapsulation 162. For illustrative purposes, the protrusion 168 and the sidewall 502 of the protrusion 168 are shown with rectangles, although it is understood that the protrusion 168 and the sidewall 502 can include any other shapes.

Figure 7:
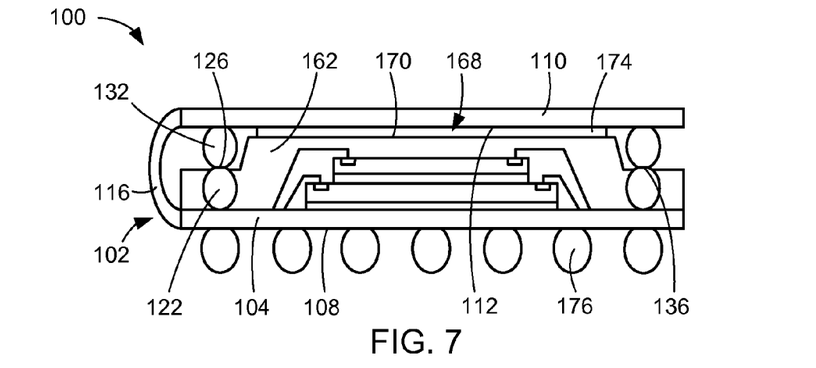
FIG. 7 is the structure of FIG. 5 in a second attaching phase.

Referring now to FIG. 7, therein is shown the structure of FIG. 5 in a second attaching phase. The integrated circuit packaging system 100 can the package substrate 102 folded such that the stack segment 110 can be over the encapsulation 162 with the stack inward surface 112 facing the top surface 170.

The integrated circuit packaging system 100 can include the stack substrate connectors 132 mounted over the base substrate connectors 122 with the second stack vertical end 136 directly on or connected to the second base vertical end 126. The integrated circuit packaging system 100 can include the protrusion 168 adjacent or between one of the stack substrate connectors 132 and another of the stack substrate connectors 132.

With the stack substrate connectors 132 directly on the base substrate connectors 122, the second attaching phase can include a reflowing process to form a metallurgical joint between the base substrate connectors 122 and the stack substrate connectors 132. For example, the stack substrate connectors 132 can be soaked into the base substrate connectors 122.

The integrated circuit packaging system 100 can include the substrate attach layer 174 attached to the stack inward surface 112 and the top surface 170. The substrate attach layer 174 can be dispensed or pre-applied.

The integrated circuit packaging system 100 can include the external connectors 176 connected to the base outward surface 108. For example, the second attaching phase can include a bottom solder ball mount (SBM) process to connect the external connectors 176.

The integrated circuit packaging system 100 can include a package singulation process to produce individual units of the integrated circuit packaging system 100. The package singulation process can include a mechanical or optical process.

The integrated circuit packaging system 100 having the package substrate 102 with the base segment 104, the stack segment 110, and the foldable segment 116 as an interposer attachment can provide more simplified process with one fold instead of two folds compared to other packages. The integrated circuit packaging system 100 having the base substrate connectors 122 and the stack substrate connectors 132 can provide cheaper manufacturing cost compared to other packages having an interposer substrate and re-distribution layer (RDL) as a method for providing connection.

Figure 8:
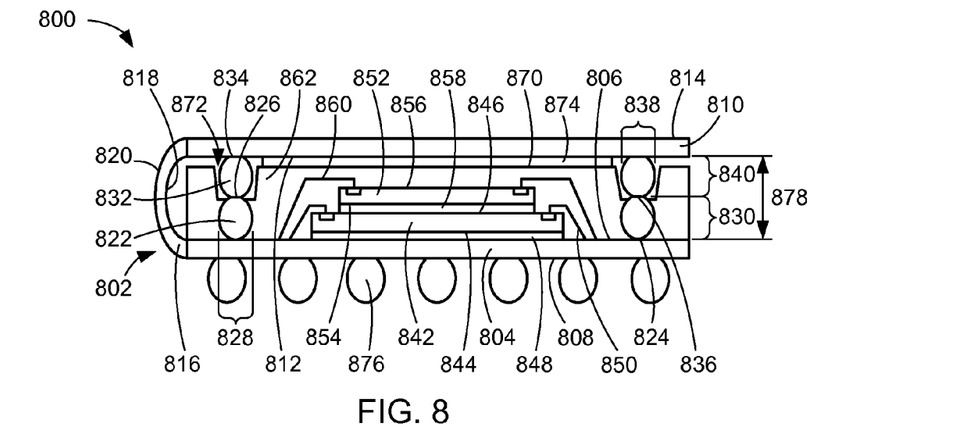
FIG. 8 is a cross-sectional view of an integrated circuit packaging system in a second embodiment of the present invention.

Referring now to FIG. 8, therein is shown a cross-sectional view of an integrated circuit packaging system 800 in a second embodiment of the present invention. The integrated circuit packaging system 800 can be formed in a manner similar to the integrated circuit packaging system 100 of FIG. 1, except for the formation of the encapsulation 162 of FIG. 1.

The integrated circuit packaging system 800 can include a package substrate 802. The package substrate 802 can include a base segment 804 having a base inward surface 806 and a base outward surface 808. The package substrate 802 can include a stack segment 810 having a stack inward surface 812 and a stack outward surface 814. The package substrate 802 can include a foldable segment 816 having a foldable inward surface 818 and a foldable outward surface 820. The package substrate 802 can be formed in manner similar to the package substrate 102 of FIG. 1.

The integrated circuit packaging system 800 can include base substrate connectors 822, each of which having a first base vertical end 824, a second base vertical end 826, a base width 828, and a base height 830. The integrated circuit packaging system 800 can include stack substrate connectors 832, each of which having a first stack vertical end 834, a second stack vertical end 836, a stack width 838, and a stack height 840. The base substrate connectors 822 and the stack substrate connectors 832 can be formed in manner similar to the base substrate connectors 122 of FIG. 1 and the stack substrate connectors 132 of FIG. 1, respectively.

The integrated circuit packaging system 800 can include a base integrated circuit 842 having a base inactive side 844 and a base active side 846. The integrated circuit packaging system 800 can include a base attach layer 848 and a base device connector 850. The base integrated circuit 842, the base attach layer 848, and the base device connector 850 can be formed in manner similar to the base integrated circuit 142 of FIG. 1, the base attach layer 148 of FIG. 1, and the base device connector 150 of FIG. 1, respectively.

The integrated circuit packaging system 800 can include a stack integrated circuit 852 having a stack inactive side 854 and a stack active side 856. The integrated circuit packaging system 800 can include a stack attach layer 858 and a stack device connector 860. The stack integrated circuit 852, the stack attach layer 858, and the stack device connector 860 can be formed in manner similar to the stack integrated circuit 152 of FIG. 1, the stack attach layer 158 of FIG. 1, and the stack device connector 160 of FIG. 1, respectively.

The integrated circuit packaging system 800 can include an encapsulation 862, which covers a semiconductor package to seal a semiconductor device providing mechanical and environmental protection. The encapsulation 862 can be formed over the base inward surface 806, the base substrate connectors 822, the base integrated circuit 842, the base device connector 850, the stack integrated circuit 852, and the stack device connector 860.

The encapsulation 862 can be formed covering the base integrated circuit 842, the base device connector 850, the stack integrated circuit 852, the stack device connector 860, and portions of the base substrate connectors 822. The encapsulation 862 can be formed partially exposing the base substrate connectors 822. The encapsulation 862 can be formed exposing the second base vertical end 826.

The encapsulation 862 can include a top surface 870, which is a top extent of the encapsulation 862. The encapsulation 862 can include a recess 872, which is an area or a portion of the encapsulation 862 that is below the top surface 870.

The recess 872 can be formed partially exposing the base substrate connectors 822. The recess 872 can be formed exposing the second base vertical end 826. The recess 872 can be formed adjacent, along, or within a periphery of the encapsulation 862.

For example, the recess 872 can include a recessed encapsulant area. Also for example, the recess 872 can be formed with any methods including laser ablating, mechanical drilling, or mold chase with protrusion.

The package substrate 802 can be folded such that the stack segment 810 can be over the encapsulation 862 with the stack inward surface 812 facing the top surface 870. Further, with the package substrate 802 folded, the stack substrate connectors 832 can be mounted over the base substrate connectors 822 with the second stack vertical end 836 directly on or connected to the second base vertical end 826. Yet further, with the package substrate 802 folded, the stack substrate connectors 832 can be connected directly on the base substrate connectors 822 and within the recess 872.

The integrated circuit packaging system 800 can include a substrate attach layer 874, external connectors 876, and an inward surface distance 878. The substrate attach layer 874, the external connectors 876, and the inward surface distance 878 can be formed in manner similar to the substrate attach layer 174 of FIG. 1, the external connectors 176 of FIG. 1, and the inward surface distance 178 of FIG. 1, respectively.

It has been discovered that the recess 872 exposing the second base vertical end 826 enhances alignment accuracy during a process of folding and attaching the package substrate 802.

Figure 9:
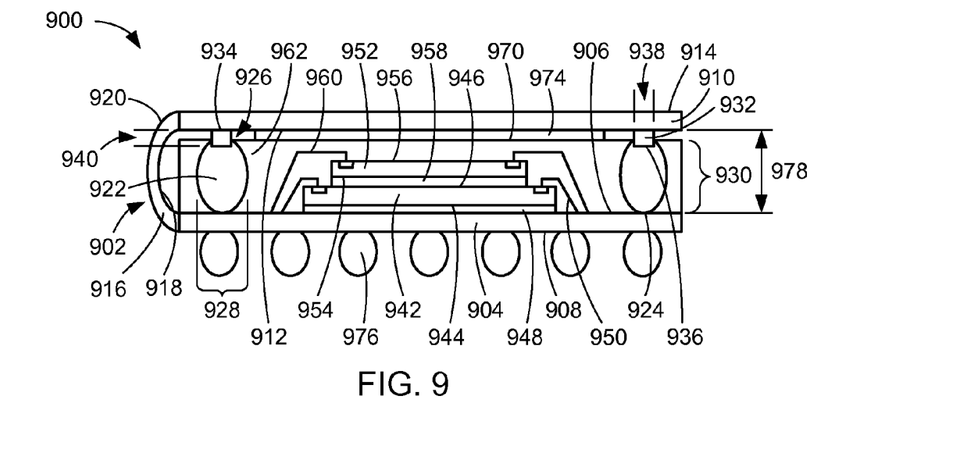
FIG. 9 is a cross-sectional view of an integrated circuit packaging system in a third embodiment of the present invention.

Referring now to FIG. 9, therein is shown a cross-sectional view of an integrated circuit packaging system 900 in a third embodiment of the present invention. The integrated circuit packaging system 900 can be formed in a manner similar to the integrated circuit packaging system 100 of FIG. 1, except for the formation of the base substrate connectors 122 of FIG. 1, the stack substrate connectors 132 of FIG. 1, and the encapsulation 162 of FIG. 1.

The integrated circuit packaging system 900 can include a package substrate 902. The package substrate 902 can include a base segment 904 having a base inward surface 906 and a base outward surface 908. The package substrate 902 can include a stack segment 910 having a stack inward surface 912 and a stack outward surface 914. The package substrate 902 can include a foldable segment 916 having a foldable inward surface 918 and a foldable outward surface 920. The package substrate 902 can be formed in manner similar to the package substrate 102 of FIG. 1.

The integrated circuit packaging system 900 can include base substrate connectors 922, which are conductive connectors, connected near non-horizontal ends or a periphery of the base segment 904. Each of the base substrate connectors 922 can include a first base vertical end 924 and a second base vertical end 926 opposite the first base vertical end 924.

The first base vertical end 924 can be electrically connected to the base inward surface 906. The first base vertical end 924 can be connected directly on the base inward surface 906.

Each of the base substrate connectors 922 can include a base width 928 and a base height 930. The base width 928 is a horizontal distance between lateral extents of each of the base substrate connectors 922. The base height 930 is a vertical distance between the first base vertical end 924 and the second base vertical end 926.

Each of the base substrate connectors 922 can include the base height 930 greater than the base width 928. For example, the base width 928 can be greater than at least half of the base height 930 and less than the base height 930.

For illustrative purposes, the base substrate connectors 922 are shown as elliptical, although it is understood that the base substrate connectors 922 can include any other shapes. For example, the base substrate connectors 922 can be formed with a shape of a rectangle.

The integrated circuit packaging system 900 can include stack substrate connectors 932, which are conductive connectors, connected near non-horizontal ends or a periphery of the stack segment 910. The stack substrate connectors 932 can be formed with a conductive material including solder, copper (Cu), gold (Au), a metallic material, or a metallic alloy.

For example, the stack substrate connectors 932 can include conductive connectors including protruded contacts, conductive columns, or conductive studs. Also for example, the stack substrate connectors 932 can include copper (Cu) columns, gold (Au) studs, or solder. Further, for example, the stack substrate connectors 932 can be formed with a process including screen printing or small ball mounting.

Each of the stack substrate connectors 932 can include a first stack vertical end 934 and a second stack vertical end 936 opposite the first stack vertical end 934. The first stack vertical end 934 can be electrically connected to the stack inward surface 912. The first stack vertical end 934 can be connected directly on the stack inward surface 912.

Each of the stack substrate connectors 932 can include a stack width 938 and a stack height 940. The stack width 938 is a horizontal distance between lateral extents of each of the stack substrate connectors 932. The stack height 940 is a vertical distance between the first stack vertical end 934 and the second stack vertical end 936.

Each of the stack substrate connectors 932 can include the stack height 940 less than the stack width 938. For example, the stack height 940 can be greater than at least half of the stack width 938 and less than the stack width 938.

For illustrative purposes, the stack height 940 is shown less than the stack width 938, although it is understood that the stack height 940 and the stack width 938 can include any lengths. Also for illustrative purposes, the stack substrate connectors 932 are shown as rectangular, although it is understood that the stack substrate connectors 932 can include any other shapes.

The integrated circuit packaging system 900 can include a base integrated circuit 942 having a base inactive side 944 and a base active side 946. The integrated circuit packaging system 900 can include a base attach layer 948 and a base device connector 950. The base integrated circuit 942, the base attach layer 948, and the base device connector 950 can be formed in manner similar to the base integrated circuit 142 of FIG. 1, the base attach layer 148 of FIG. 1, and the base device connector 150 of FIG. 1, respectively.

The integrated circuit packaging system 900 can include a stack integrated circuit 952 having a stack inactive side 954 and a stack active side 956. The integrated circuit packaging system 900 can include a stack attach layer 958 and a stack device connector 960. The stack integrated circuit 952, the stack attach layer 958, and the stack device connector 960 can be formed in manner similar to the stack integrated circuit 152 of FIG. 1, the stack attach layer 158 of FIG. 1, and the stack device connector 160 of FIG. 1, respectively.

The integrated circuit packaging system 900 can include an encapsulation 962, which covers a semiconductor package to seal a semiconductor device providing mechanical and environmental protection. The encapsulation 962 can be formed over the base inward surface 906, the base substrate connectors 922, the base integrated circuit 942, the base device connector 950, the stack integrated circuit 952, and the stack device connector 960.

The encapsulation 962 can be formed covering the base integrated circuit 942, the base device connector 950, the stack integrated circuit 952, the stack device connector 960, and portions of the base substrate connectors 922. The encapsulation 962 can be formed partially exposing the base substrate connectors 922. The encapsulation 962 can be formed exposing the second base vertical end 926.

The encapsulation 962 can include a top surface 970, which is a top extent of the encapsulation 962. The encapsulation 962 can be formed exposing a portion of the base substrate connectors 922. The encapsulation 962 can be formed exposing the second base vertical end 926 at the top surface 970.

With the second base vertical end 926 exposed, the stack substrate connectors 932 can be connected to the base substrate connectors 922. The second stack vertical end 936 of one of the stack substrate connectors 932 can downwardly protrude or extend into one of the base substrate connectors 922 such that the second stack vertical end 936 can be below the top surface 970 or the second base vertical end 926.

The package substrate 902 can be folded such that the stack segment 910 can be over the encapsulation 962 with the stack inward surface 912 facing the top surface 970. Further, with the package substrate 902 folded, the stack substrate connectors 932 can be mounted over the base substrate connectors 922 with the second stack vertical end 936 directly on or connected to the second base vertical end 926.

The integrated circuit packaging system 900 can include a substrate attach layer 974, external connectors 976, and an inward surface distance 978. The substrate attach layer 974 and the external connectors 976 can be formed in manner similar to the substrate attach layer 174 of FIG. 1 and the external connectors 176 of FIG. 1, respectively.

The base width 928 and the base height 930 can preferably be greater than the stack width 938 and the stack height 940, respectively. The base height 930 can be greater than half of the inward surface distance 978 of the package substrate 902. The stack height 940 can be less than half of the inward surface distance 978.

The inward surface distance 978 is a distance between the base inward surface 906 and the stack inward surface 912. The inward surface distance 978 can be determined based on a predetermined length of the foldable segment 916. In other words, the foldable segment 916 can include the predetermined length to provide sufficient spacing for the stack substrate connectors 932 connected directly on the base substrate connectors 922.

It has been discovered that the base width 928 and the base height 930 greater than the stack width 938 and the stack height 940, respectively, provide a robust structure for mounting the second stack vertical end 936 directly on the second base vertical end 926.

Figure 10:
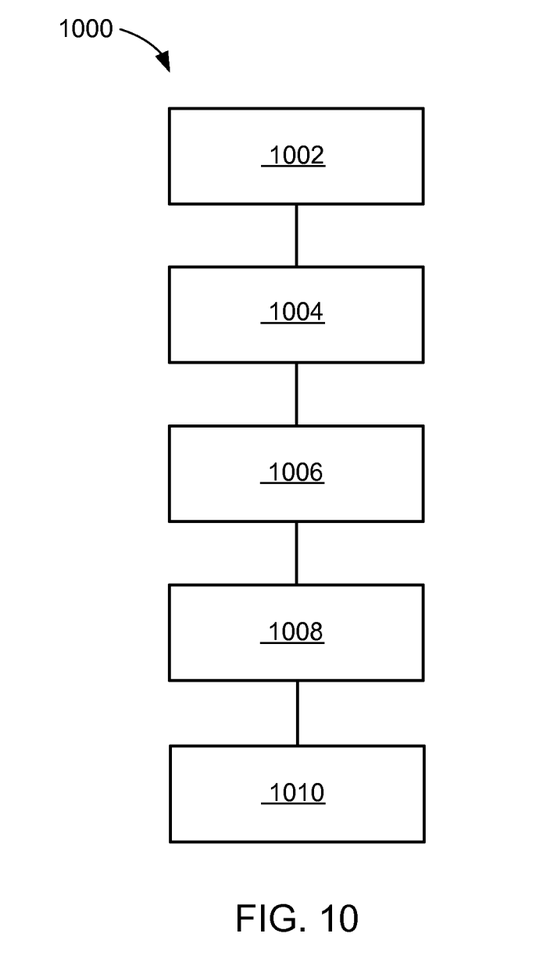
FIG. 10 is a flow chart of a method of manufacture of the integrated circuit packaging system in a further embodiment of the present invention.

Referring now to FIG. 10, therein is shown a flow chart of a method 1000 of manufacture of the integrated circuit packaging system 100 in a further embodiment of the present invention. The method 1000 includes: providing a package substrate having a foldable segment, a base segment, and a stack segment in a block 1002; connecting a base substrate connector directly on the base segment in a block 1004; connecting a stack substrate connector directly on the stack segment in a block 1006; mounting a base integrated circuit over the base segment with the base substrate connector outside a perimeter of the base integrated circuit in a block 1008; and folding the package substrate with the stack segment over the base segment and the stack substrate connector directly on the base substrate connector in a block 1010.

The present invention can include an integrated circuit packaging system having a structure with a combination of key features or embodiments previously described. The present invention can include an electrical component with conductive connectors mounted over one of the embodiments. The present invention can include one of the embodiments mounted over another of the embodiments. The present invention can include an electrical component with conductive connectors mounted over one of the embodiments over a fan-out package-on-package (PoP) package or a fan-in package-on-package (PoP) package.

The electrical component can include any number of semiconductor devices. The electrical component can include a package structure having a substrate, a number of stacked semiconductor devices attached and connected to the substrate, a package cover, and conductive connectors. The electrical component can include a package structure having leads, a die attach paddle, a number of stacked semiconductor devices attached to the die attach paddle and connected to the leads, and a package cover. The electrical component can include a structure having a substrate and a number of semiconductor devices including a flip chip, an integrated circuit package, a passive component, or a discrete component mounted over the substrate. The electrical component can include a passive device or a discrete component. The electrical component can include a flip chip, a semiconductor device, or an integrated circuit package.

Thus, it has been discovered that the integrated circuit packaging system of the present invention furnishes important and heretofore unknown and unavailable solutions, capabilities, and functional aspects for an integrated circuit packaging system with a flexible substrate. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package substrate having a foldable segment, a base segment, and a stack segment;
   connecting a base substrate connector directly on the base segment;
   connecting a stack substrate connector directly on the stack segment;
   mounting a base integrated circuit over the base segment with the base substrate connector outside a perimeter of the base integrated circuit;
   forming an encapsulation over the base integrated circuit including forming the encapsulation having a recess partially exposing the base substrate connector; and
   folding the package substrate with the stack segment over the base segment and the stack substrate connector directly on the base substrate connector and package substrate within the recess.

2. The method as claimed in claim 1 further comprising attaching a substrate attach layer to the stack segment and the encapsulation.

3. The method as claimed in claim 1 wherein providing the package substrate includes providing the package substrate having the base segment with a length equal to a length of the stack segment, the package substrate having the foldable segment with a length greater than a length equal to a combination of a base height of the base substrate connector and a stack height of the stack substrate connector.

4. The method as claimed in claim 1 further comprising forming the base substrate connector having a base height greater than a stack height of the stack substrate connector, the base height greater than half of an inward surface distance of the package substrate.

5. An integrated circuit packaging system comprising:
   a package substrate having a foldable segment, a base segment, and a stack segment;
   a base substrate connector directly on the base segment;
   a stack substrate connector directly on the stack segment;
   a base integrated circuit over the base segment with the base substrate connector outside a perimeter of the base integrated circuit, the stack segment folded over the base segment, and the stack substrate connector directly on the base substrate connector;
   an encapsulation over the base integrated circuit, the encapsulation includes a recess partially exposing the base substrate connector; and
   the stack substrate connector is directly on the base substrate connector within the recess.

6. The system as claimed in claim 5 further comprising a substrate attach layer attached to the stack segment.

7. The system as claimed in claim 5 wherein the package substrate includes the base segment having a length equal to a length of the stack segment.

8. The system as claimed in claim 5 wherein the base substrate connector includes a base height greater than a stack height of the stack substrate connector.

9. The system as claimed in claim 5 further comprising a substrate attach layer attached to the stack segment and the encapsulation.

10. The system as claimed in claim 5 wherein the package substrate includes the base segment with a length equal to a length of the stack segment, the package substrate having the foldable segment with a length greater than a length equal to a combination of a base height of the base substrate connector and a stack height of the stack substrate connector.

11. The system as claimed in claim 5 wherein the base substrate connector includes a base height greater than a stack height of the stack substrate connector, the base height greater than half of an inward surface distance of the package substrate.

* * * * *

UNITED STATES PATENT AND TRADEMARK OFFICE
CERTIFICATE OF CORRECTION

| | | |
|---|---|---|
| PATENT NO. | : 8,421,203 B2 | Page 1 of 1 |
| APPLICATION NO. | : 12/948756 | |
| DATED | : April 16, 2013 | |
| INVENTOR(S) | : Chi et al. | |

It is certified that error appears in the above-identified patent and that said Letters Patent is hereby corrected as shown below:

In the Claims:

Column 15, claim 1, lines 40-41, delete "and package substrate within"
and insert therefor --and within--

Signed and Sealed this
Tenth Day of November, 2015

Michelle K. Lee
*Director of the United States Patent and Trademark Office*